United States Patent
Bourniche et al.

(10) Patent No.: US 12,101,047 B2
(45) Date of Patent: Sep. 24, 2024

(54) SYSTEMS AND METHODS FOR INVERTER WITH HYBRID POWER DEVICE SWITCHING

(71) Applicant: BorgWarner Luxembourg Automotive Systems SA, Bascharage (LU)

(72) Inventors: Eric Bourniche, Preutin-Higny (FR); Pascal David, Luxembourg (LU)

(73) Assignee: Borg Warner Luxembourg Automotive Systems SA, Bascharage (LU)

( * ) Notice: Subject to any disclaimer, the term of this patent is extended or adjusted under 35 U.S.C. 154(b) by 275 days.

(21) Appl. No.: 17/658,686

(22) Filed: Apr. 11, 2022

(65) Prior Publication Data
US 2023/0327597 A1 Oct. 12, 2023

(51) Int. Cl.
*H02P 27/08* (2006.01)
*H03K 17/567* (2006.01)
*H03K 17/687* (2006.01)

(52) U.S. Cl.
CPC .......... *H02P 27/08* (2013.01); *H03K 17/567* (2013.01); *H03K 17/6874* (2013.01)

(58) Field of Classification Search
CPC ... H02P 27/08; H03K 17/567; H03K 17/6874
USPC .......................................................... 363/97
See application file for complete search history.

(56) References Cited

U.S. PATENT DOCUMENTS

| | | |
|---|---|---|
| 6,522,089 B1 | 2/2003 | Duong et al. |
| 6,930,473 B2 | 8/2005 | Elbanhawy |
| 7,423,332 B2 | 9/2008 | Gerbsch et al. |
| 8,058,744 B2 | 11/2011 | Chen et al. |
| 8,600,595 B2 | 12/2013 | Gleason et al. |
| 9,296,304 B2 | 3/2016 | Krause |
| 9,397,657 B1 | 7/2016 | Zhao et al. |
| 9,997,989 B2 | 6/2018 | Butzmann et al. |
| 10,439,605 B2 | 10/2019 | Apelsmeier et al. |

(Continued)

FOREIGN PATENT DOCUMENTS

| | | |
|---|---|---|
| CN | 101651406 A | 2/2010 |
| CN | 102801317 A | 11/2012 |

(Continued)

OTHER PUBLICATIONS

Full SiC & Hybrid Sic IBGTs, https://www.richardsonrfpd.com/docs/rfpd/Full_SiC_and_Hybrid_SiC_IGBTs.pdf retrieved Feb. 21, 2022 (2 pages).

(Continued)

*Primary Examiner* — Yemane Mehari
(74) *Attorney, Agent, or Firm* — Joshua M. Haines; Bookoff McAndrews, PLLC

(57) ABSTRACT

A system for a power switch module for an inverter includes a Silicon (Si) power switch configured to pass current in an on state based on an Si gate driving signal, a Silicon Carbide (SiC) power switch configured to pass current in an on state based on an SiC gate driving signal, an Si gate driver configured to provide the Si gate driving signal to operate the Si power switch when a current requirement of the inverter is at or above a threshold, and an SiC gate driver configured to provide the SiC gate driving signal to operate the SiC power switch when the current requirement of the inverter is below the threshold.

20 Claims, 12 Drawing Sheets

(56) References Cited

U.S. PATENT DOCUMENTS

| | | |
|---|---|---|
| 2003/0038615 A1 | 2/2003 | Elbanhawy |
| 2010/0080024 A1 | 4/2010 | Wei et al. |
| 2012/0163035 A1 | 6/2012 | Song et al. |
| 2013/0257177 A1 | 10/2013 | Jacobson et al. |
| 2016/0043616 A1 | 2/2016 | Krishnamurthy et al. |
| 2016/0191021 A1* | 6/2016 | Zhao .................... H03K 17/567 327/109 |
| 2016/0191046 A1* | 6/2016 | Zhao .................... H03K 17/567 327/419 |
| 2017/0305283 A1* | 10/2017 | Huh ........................ H02P 27/08 |
| 2022/0297555 A1* | 9/2022 | Prasad ............... B60H 1/00428 |
| 2022/0297557 A1* | 9/2022 | Prasad ................ H02M 3/1586 |
| 2022/0302836 A1* | 9/2022 | Prasad ................ H02M 3/1586 |

FOREIGN PATENT DOCUMENTS

| | | |
|---|---|---|
| CN | 104567055 A | 4/2015 |
| DE | 10010957 A1 | 9/2001 |
| DE | 102012205725 A1 | 10/2013 |

OTHER PUBLICATIONS

Huang et al., "6.5 kV Si/SiC hybrid power module: An ideal next step ?." 2015 IEEE International Workshop on Integrated Power Packaging (IWIPP). IEEE, 2015 (4 pages).

Ning et al., "A Hybrid Si IGBT and SiC MOSFET Module Development" CES Transaction on Electrical Machines and Systems, vol. 1, No. 3, Dec. 2017, pp. 360-366.

Ortiz et al. "Mixed MOSFET-IGBT Bridge for High-Efficient Medium-Frequency Dual-Active-Bridge Converter in Solid State Transformers" Proceedings of the 14th IEEE Workshop on Control and Modeling for Power Electronics (COMPEL 2013), Salt Lake City, USA, Jun. 23-26, 2013 (9 pages).

* cited by examiner

SYSTEMS AND METHODS FOR INVERTER WITH HYBRID POWER DEVICE SWITCHING

TECHNICAL FIELD

Various embodiments of the present disclosure relate generally to a hybrid power switch for an inverter, and an inverter and motor connected system including the same, and, more particularly, to a hybrid power switch for an inverter that operates using different types of switches under different operating conditions.

BACKGROUND

Inverters, such as those used to drive a motor in an electric vehicle, for example, are responsible for converting High Voltage Direct Current (HVDC) into Alternating Current (AC) to drive the motor. A basic three phase inverter includes a bridge with six power device switches (for example, power transistors such as IGBT) that are controlled by Pulse Width Modulation (PWM) signals generated by a microcontroller.

Inverters for electric vehicles are designed to handle high current in order to provide high levels of dynamic operating conditions. For the inverter, a high performance requirement may be limited to a short period of time, such as during an overtake maneuver or short periods of mountain driving with a trailer, for example. However, the majority of operation of electric vehicles is similar to what is encountered during Worldwide harmonized Light-duty vehicles Test Cycles (WLTC), where the inverter is generally providing power for low torque (and consequently, low current) and low speed operation of the vehicle.

Accordingly, inverters may include components that are under-utilized for a majority of operating conditions of the inverter.

The present disclosure is directed to overcoming one or more of these above-referenced challenges.

SUMMARY OF THE DISCLOSURE

In some aspects, the techniques described herein relate to a system for a power switch module for an inverter, the system including: a Silicon (Si) power switch configured to pass current in an on state based on an Si gate driving signal; a Silicon Carbide (SiC) power switch configured to pass current in an on state based on an SiC gate driving signal; an Si gate driver configured to provide the Si gate driving signal to operate the Si power switch when a current requirement of the inverter is at or above a threshold; and an SiC gate driver configured to provide the SiC gate driving signal to operate the SiC power switch when the current requirement of the inverter is below the threshold.

In some aspects, the techniques described herein relate to a system, wherein the Si power switch includes two Si dies, and the SiC power switch includes two SiC dies.

In some aspects, the techniques described herein relate to a system, wherein the two Si dies are an insulated-gate bipolar transistor (IGBT) and a diode.

In some aspects, the techniques described herein relate to a system, wherein the two SiC dies are metal-oxide-semiconductor field-effect transistors (MOSFETs).

In some aspects, the techniques described herein relate to a system, further including a source tab and a drain tab electrically connected to the Si power switch and the SiC power switch.

In some aspects, the techniques described herein relate to a system, wherein the Si gate driver and the SiC gate driver are respective pins on the power switch module of the inverter.

In some aspects, the techniques described herein relate to a system, further including: a Kelvin emitter pin, a temperature sensor +pin, a temperature sensor −pin, a driver source pin, and a current sensor pin.

In some aspects, the techniques described herein relate to a system, wherein the threshold is provided as a percentage of a maximum current capability of the inverter, and a number of dies of each of the Si power switch and the SiC power switch is selected based on the threshold and the maximum current capability while maintaining a same package for the power switch module.

In some aspects, the techniques described herein relate to a system, wherein the threshold is provided as 33% of a maximum current capability ($I_{max}$) of the inverter, so that the SiC power switch is operated below 33% $I_{max}$ and the Si power switch is operated at or above 33% $I_{max}$.

In some aspects, the techniques described herein relate to a system, wherein $I_{max}$ is 400 Arms, an area of the Si power switch is 350 mm2 and an area of the SiC power switch is 44 mm2.

In some aspects, the techniques described herein relate to a system, wherein the Si gate driver is further configured to turn off the Si power switch when the current requirement of the inverter is below the threshold, and the SiC gate driver is further configured to turn off the SiC power switch when the current requirement of the inverter is at or above the threshold.

In some aspects, the techniques described herein relate to a system, wherein the Si gate driver is further configured to turn off the Si power switch when the current requirement of the inverter is below the threshold, and the SiC gate driver is further configured to operate the SiC power switch when the current requirement of the inverter is at or above the threshold.

In some aspects, the techniques described herein relate to a system, further including: a set of input terminals configured to pass direct current (DC) power; and a set of output terminals configured to pass alternating current (AC) power, wherein the power switch module is configured to receive a signal from a controller to operate the Si gate driver and the SiC gate driver to generate AC power from DC power received through the set of input terminals or to generate DC power from AC power received through the set of the output terminals.

In some aspects, the techniques described herein relate to a system, wherein the inverter is configured to receive or generate the DC power and receive or generate the AC power; and the system further includes: a motor configured to receive the generated AC power from the inverter, and to rotate based on the received AC power, or to provide generated AC power to the inverter based on a rotation of the motor.

In some aspects, the techniques described herein relate to a method for controlling a power switch module for an inverter, the method including: providing, by a Silicon (Si) gate driver, an Si gate driving signal to operate an Si power switch of the power switch module when a current requirement of the inverter is at or above a threshold, wherein the Si power switch is configured to pass current in an on state based on the Si gate driving signal, and providing, by a Silicon Carbide (SiC) gate driver, an SiC gate driving signal to operate an SiC power switch of the power switch module when the current requirement of the inverter is below the threshold, wherein the SiC power switch is configured to pass current in an on state based on the SiC gate driving signal.

In some aspects, the techniques described herein relate to a method, wherein the threshold is provided as 33% of a maximum current capability ($I_{max}$) of the inverter, so that the SiC power switch is operated below 33% $I_{max}$ and the Si power switch is operated at or above 33% $I_{max}$.

In some aspects, the techniques described herein relate to a method, wherein the providing the Si gate driving signal includes turning off the Si power switch when the current requirement of the inverter is below the threshold, and the providing the SiC gate driving signal includes turning off the SiC power switch when the current requirement of the inverter is at or above the threshold.

In some aspects, the techniques described herein relate to a method, wherein the providing the Si gate driving signal includes turning off the Si power switch when the current requirement of the inverter is below the threshold, and the providing the SiC gate driving signal includes operating the SiC power switch when the current requirement of the inverter is at or above the threshold.

In some aspects, the techniques described herein relate to a system including a controller to control a power switch module of a direct-current (DC) to alternating current (AC) inverter, the controller including: a memory configured to store instructions; and at least one processor configured to execute the stored instructions to perform operations including: providing, to a Silicon (Si) gate driver of the power switch module, an Si gate driving signal to operate an Si power switch of the power switch module when a current requirement of the inverter is at or above a threshold, wherein the Si power switch is configured to pass current in an on state based on the Si gate driving signal, and providing, by a Silicon Carbide (SiC) gate driver of the power switch module, an SiC gate driving signal to operate an SiC power switch of the power switch module when the current requirement of the inverter is below the threshold, wherein the SiC power switch is configured to pass current in an on state based on the SiC gate driving signal.

In some aspects, the techniques described herein relate to a system, wherein the providing the Si gate driving signal includes turning off the Si power switch when the current requirement of the inverter is below the threshold, and wherein the providing the SiC gate driving signal includes: turning off the SiC power switch when the current requirement of the inverter is at or above the threshold, or operating the SiC power switch when the current requirement of the inverter is at or above the threshold.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
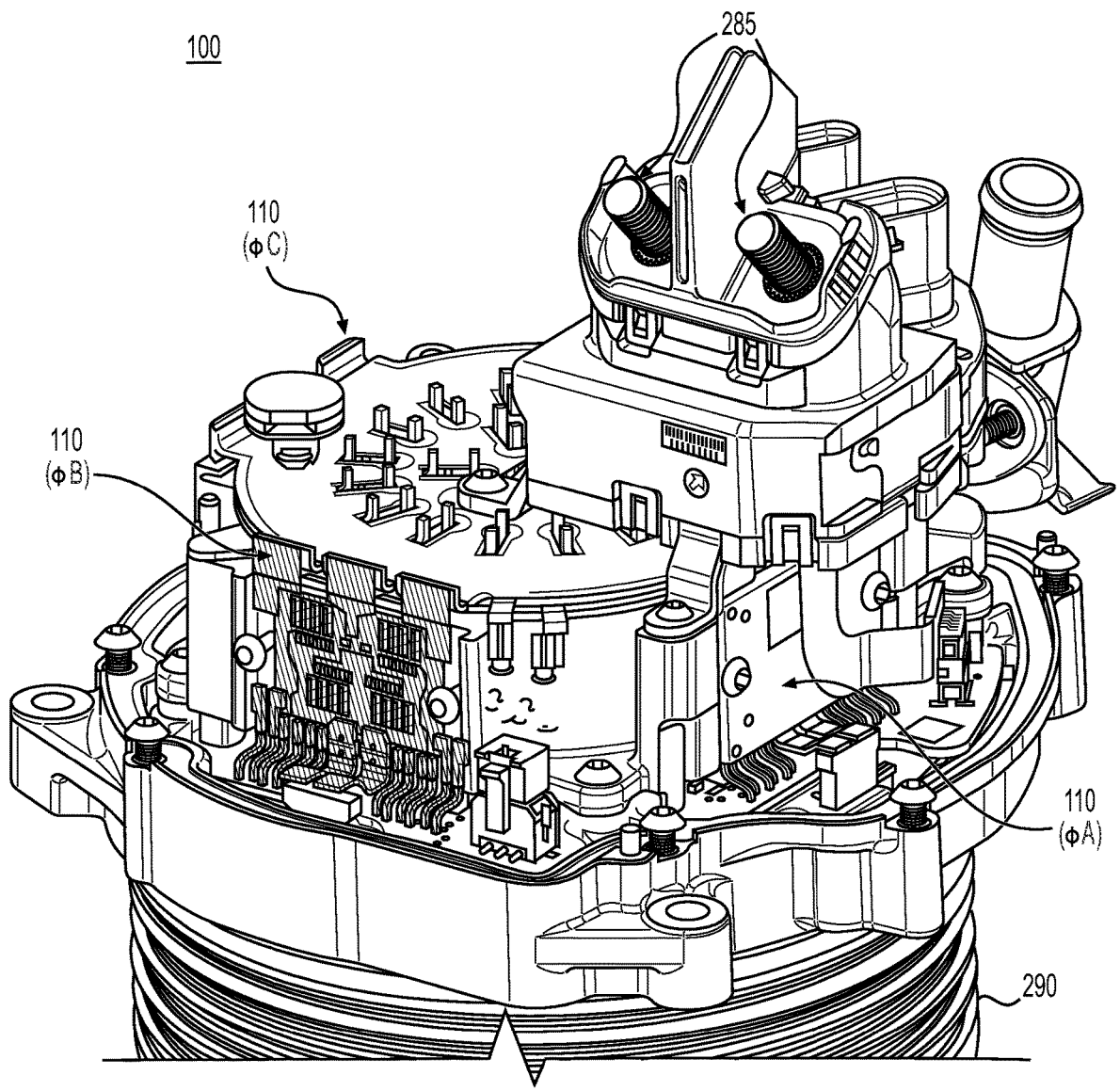
FIG. 1 depicts an inverter, according to one or more embodiments.

Various embodiments of the present disclosure relate generally to a hybrid power switch for an inverter and, more particularly, to a hybrid power switch for an inverter that operates using different types of switches under different operating conditions. As will be apparent from the embodiments below, advantages to the disclosed systems and methods may include a higher efficiency power switch for most driving conditions, a retention of high current capability when high power is required, a preservation of peak performance capabilities of the power switch, a reduction of cost of the power module, a reduction in material of a limited resource, and/or a scalable solution while maintaining standard packaging and integration into the inverter.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices Q1-Q6 may be described as switches or devices, but may refer to any device capable of controlling the flow of power in an electrical circuit. For example, devices Q1-Q6 may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Aspects of the present disclosure may be embodied in a special purpose computer and/or data processor that is specifically programmed, configured, and/or constructed to perform one or more of the computer-executable instructions explained in detail herein. While aspects of the present disclosure, such as certain functions, are described as being performed exclusively on a single device, the present disclosure may also be practiced in distributed environments where functions or modules are shared among disparate processing devices, which are linked through a communications network, such as a Local Area Network ("LAN"), Wide Area Network ("WAN"), and/or the Internet. Similarly, techniques presented herein as involving multiple devices may be implemented in a single device. In a distributed computing environment, program modules may be located in both local and/or remote memory storage devices.

Aspects of the present disclosure may be stored and/or distributed on non-transitory computer-readable media, including magnetically or optically readable computer discs, hard-wired or preprogrammed chips (e.g., EEPROM semiconductor chips), nanotechnology memory, or other data storage media. Alternatively, computer implemented instructions, data structures, screen displays, and other data under aspects of the present disclosure may be distributed over the Internet and/or over other networks (including wireless networks), on a propagated signal on a propagation medium (e.g., an electromagnetic wave(s), a sound wave, etc.) over a period of time, and/or they may be provided on any analog or digital network (packet switched, circuit switched, or other scheme).

Figure 2:
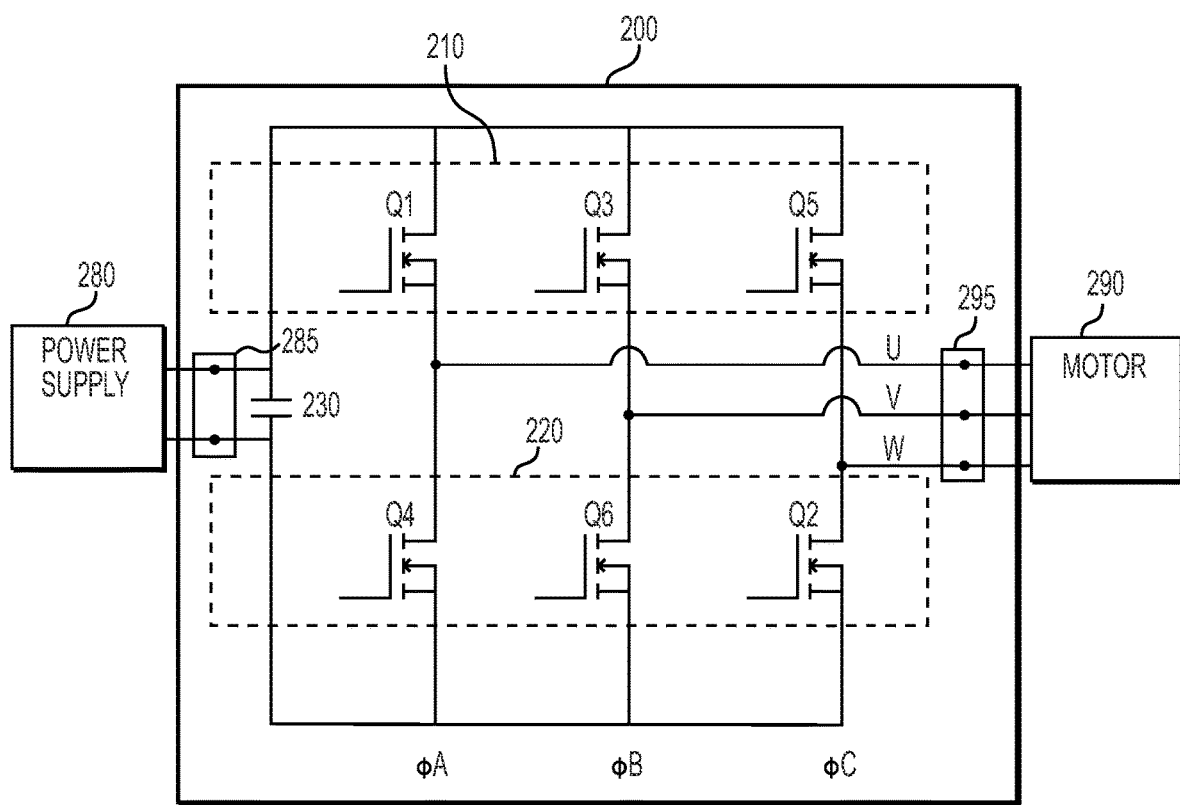
FIG. 2 depicts an electrical power schematic of an inverter in a connected system, according to one or more embodiments.

FIG. 1 depicts an inverter, according to one or more embodiments. FIG. 2 depicts an electrical power schematic of an inverter, according to one or more embodiments. The inverter may be used to convert DC power from a battery in an electric vehicle to AC power, to drive an electric motor of the electric vehicle, for example, but the embodiments are not limited thereto. Additionally, the inverter may be bidirectional, and used to convert DC power to AC power, or to convert AC power to DC power, such as during regenerative braking, for example.

As shown in FIGS. 1 and 2, an inverter 100 may include heat sink 110 and power board 200, and may be connected to a DC power supply 280 and a motor 290. Power board 200 may include first three-phase switch group 210, and second three-phase switch group 220. A first phase U may correlate with OA including switches Q1 and Q4, a second phase V may correlate with ϕB including switches Q3 and Q6, and a third phase W may correlate with ϕC including switches Q5 and Q2, as illustrated in FIG. 2. First three-phase switch group 210 may include first phase switch Q1, second phase switch Q3, and third phase switch Q5. Second three-phase switch group 220 may include first phase switch Q4, second phase switch Q6, and third phase switch Q2. Switches Q1-Q6 may be metal-oxide-semiconductor field-effect transistors (MOSFET), for example, but are not limited thereto.

The first three-phase switch group 210 and second three-phase switch group 220 may be driven by PWM signals generated by inverter controller 300 (shown in FIG. 3) to convert DC power delivered via the set of input terminals 285 at capacitor 230 to three phase AC power at outputs U, V, and W via the set of output terminals 295 to motor 290. Additionally, although FIGS. 1 and 2 illustrate a three-phase inverter, the disclosure is not limited thereto, and may include single phase or multi-phase inverters. Additionally, the inverter may be bidirectional, and used to convert DC power to AC power, or to convert AC power to DC power, such as during regenerative braking, for example.

Figure 3:
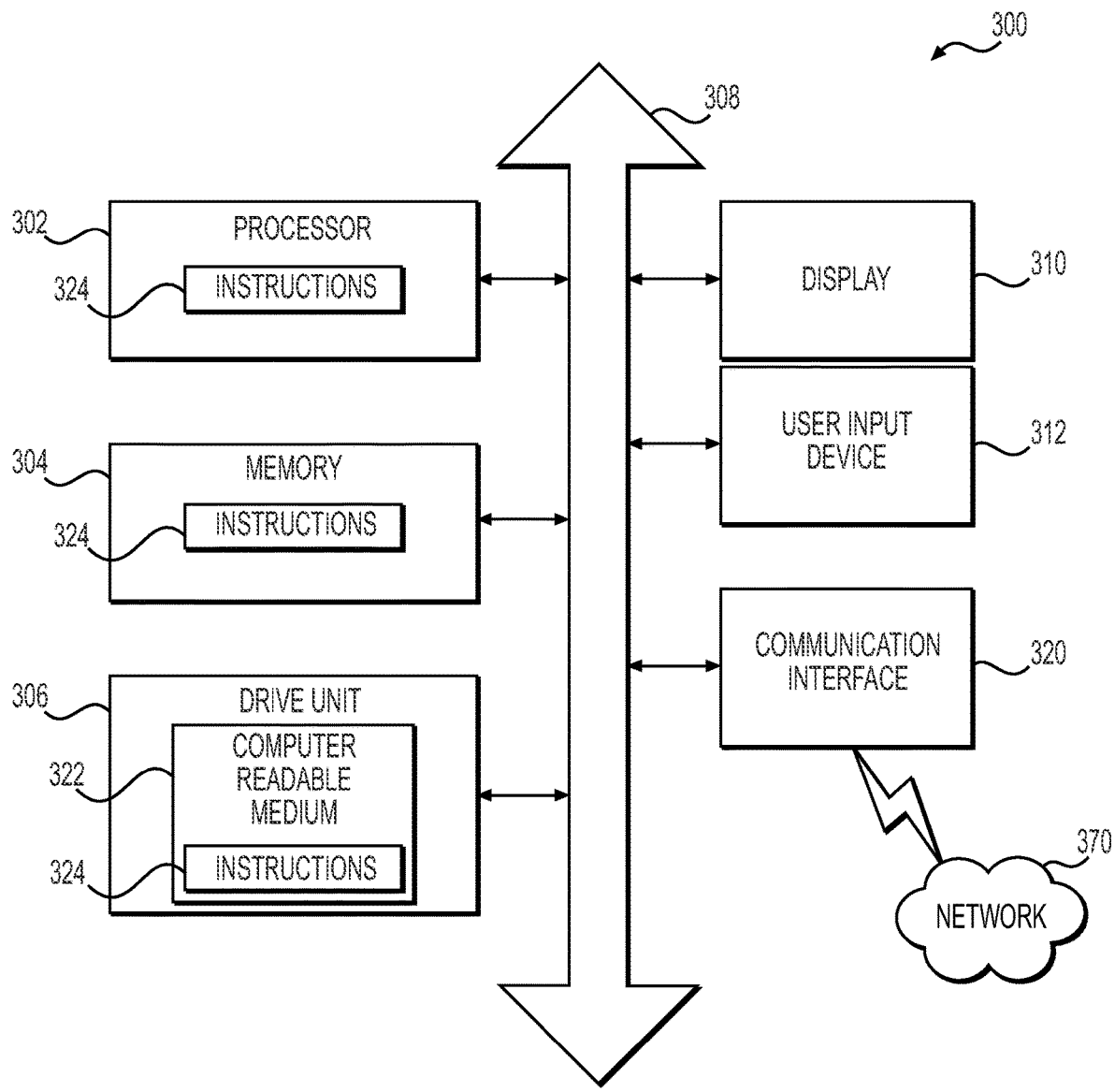
FIG. 3 depicts an implementation of a computer system that may execute techniques presented herein, according to one or more embodiments.

FIG. 3 depicts an implementation of an inverter controller 300 that may execute techniques presented herein, according to one or more embodiments. Inverter controller 300 may include one or more controllers to generate the PWM signals during a normal condition of the inverter and during a fault condition of the inverter.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As illustrated in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component/object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
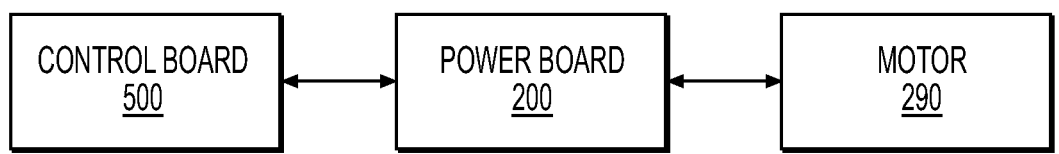
FIG. 4 depicts a connected system including a control board, a power board, and a motor, according to one or more embodiments.

FIG. 4 depicts a connected system including a control board 500, a power board 200, and a motor 290, according to one or more embodiments. The control board 500 may, among other functions, generate one or more PWM signals and monitor a status of various components. The power board 200 may include the first three-phase switch group 210 and second three-phase switch group 220, which may be driven by the PWM signals generated by inverter controller 300 to convert DC power delivered via the set of input terminals 285 at capacitor 230 to three phase AC power at outputs U, V, and W via the set of output terminals 295 to motor 290. However, the disclosure is not limited thereto, and components and functions of the control board 500 and power board 200 may be provided on either or both of the control board 500 and power board 200. Additionally, the control board 500 and power board 200 may be provided as a single integrated board including both control board 500 and power board 200, or separately where each of the control board 500 and power board 200 is provided as one or more boards.

Figure 5:
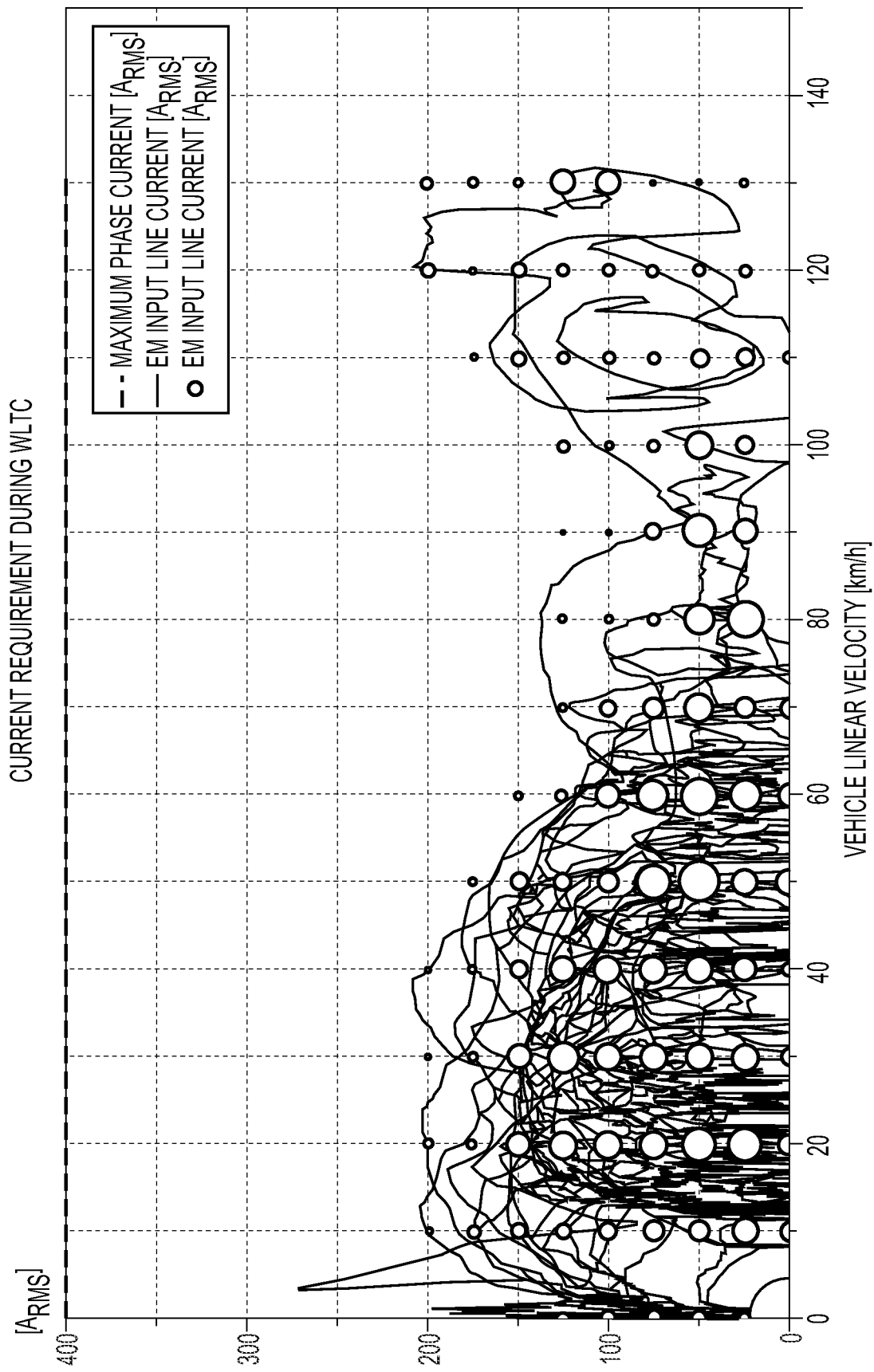
FIG. 5 depicts an inverter current requirement relative to maximum current capability along a linear velocity axis, according to one or more embodiments.

FIG. 5 depicts an inverter current requirement relative to maximum current capability along a linear velocity axis, according to one or more embodiments.

As shown in FIG. 5, a maximum current capability of the inverter 100 may be provided at 400 $A_{rms}$, and is not reached during the WLTC. Moreover, current capability of the inverter 100 above 200 $A_{rms}$ is rarely used during the WLTP cycle.

With a current capability of 133 $A_{rms}$ (⅓ of the maximum current capability of 400 $A_{rms}$), the inverter 100 would satisfy most of the current requirements of the WLTP cycle. Accordingly, the inverter 100 may be overdesigned in a sense that the main criteria for inverter maximum current capability is based on the maximum performance, such as maximum acceleration, for example, of a vehicle, but a large portion of the current capabilities may be rarely used.

In order to obtain the highest efficiency for the inverter 100, many inverters may be designed to use Silicon Carbide (SiC) dies as devices for first three-phase switch group 210 and second three-phase switch group 220. The gain of SiC technology in terms of loss reduction of the inverter 100 compared to Silicon (Si) may be up to 70% for low current operation. Accordingly, SiC dies are frequently used in inverter design.

Figure 6:
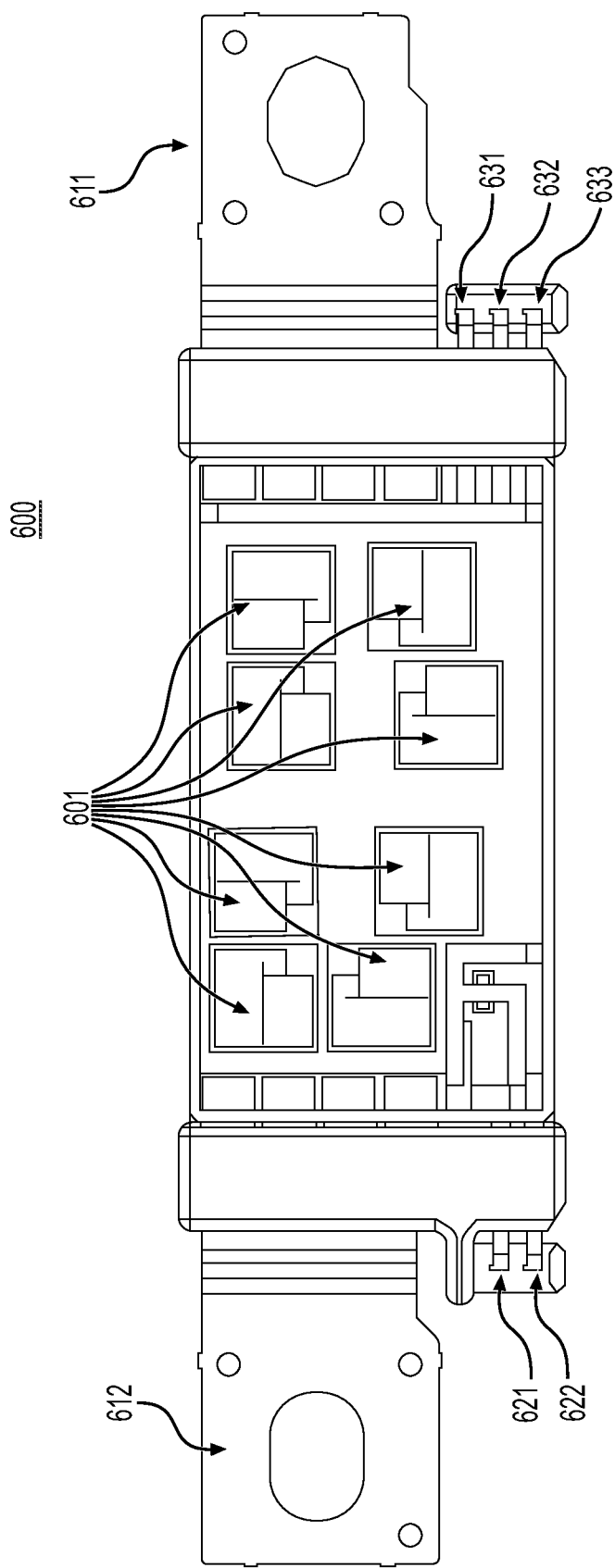
FIG. 6 depicts an inverter power switch with eight Silicon Carbide dies, according to one or more embodiments.

FIG. 6 depicts an inverter power module 600 with eight SiC MOSFET dies 601, according to one or more embodiments.

As shown in FIG. 6, an inverter power module 600 may use eight SiC MOSFET dies 601, where each SiC die 601 may be approximately 25 $mm^2$. The inverter power module 600 may include a source tab 611 and a drain tab 612 to pass current, and control pins including pins temperature sensor +621, temperature sensor −622, gate 631, driver source 632, and current sensor 633 for monitoring and control of the SiC dies 601.

Figure 7:
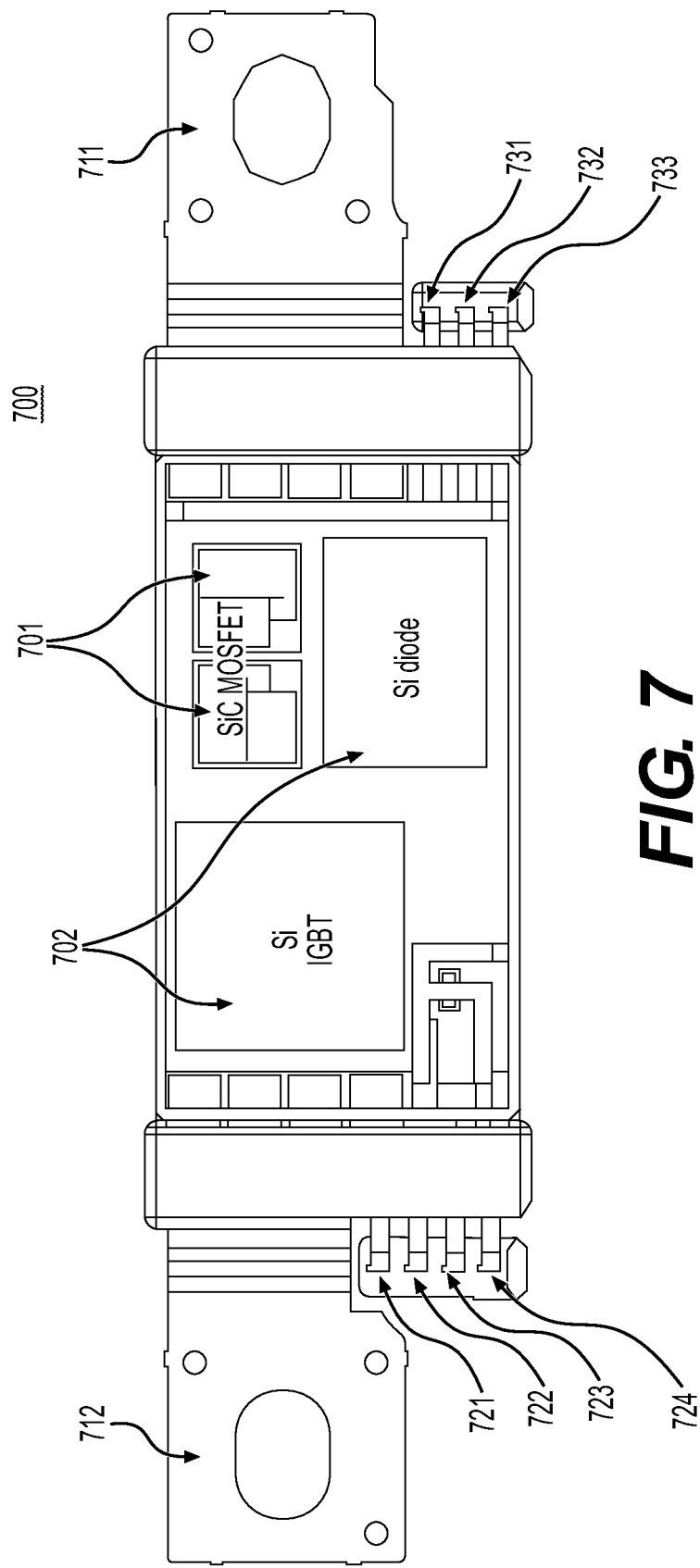
FIG. 7 depicts a hybrid inverter power switch with Silicon dies and Silicon Carbide dies, according to one or more embodiments.

FIG. 7 depicts a hybrid inverter power switch module 700 with Si dies 702 and SiC dies 701, according to one or more embodiments.

As shown in FIG. 7, a system for a power switch module 700 may include an Si power switch 702 configured to pass current in an on state based on an Si gate driving signal, and an SiC power switch 701 configured to pass current in an on state based on an SiC gate driving signal. The power switch module 700 may include an Si gate driver configured to provide the Si gate driving signal to operate the Si power switch 702 when a current requirement of the inverter 100 is at or above a threshold 810 (see region 830 in FIG. 8), and an SiC gate driver configured to provide the SiC gate driving signal to operate the SiC power switch 701 when the current requirement of the inverter 100 is below the threshold 810 (see region 820 in FIG. 8).

In the disclosure, the term "operate" refers to operating a power switch to turn on and off with a periodic operation at a provided frequency, such as 5 kHz or 25 kHz, for example. For example, SiC power switch 701 may be configured to pass current in an on state based on an SiC gate driving signal that operates SiC power switch 701 to turn on and off with a periodic operation at a provided frequency. The operation of SiC power switch 701 provides periodic on and off switching, and current is passed in the on state of the operation of SiC power switch 701. Additionally, periodic on and off switching may refer to any suitable power switching including one or more of hard switching, soft switching, zero current switching, or zero voltage switching, for example.

The Si power switch 702 may include two Si dies, and the SiC power switch 701 may include two SiC dies. The Si power switch 702 may include exactly two Si dies, and the SiC power switch 701 may include exactly two SiC dies. The two Si dies of Si power switch 702 may be an insulated-gate bipolar transistor (IGBT) and a diode, and the two SiC dies of SiC power switch 701 may be metal-oxide-semiconductor field-effect transistors (MOSFETs). The configurations above are provided merely as examples, and the disclosure is not limited thereto.

The power switch module 700 may include a source tab 711 and a drain tab 712 electrically connected to the SiC power switch 701 and the Si power switch 702, respectively. The Si gate driver and the SiC gate driver may be provided from respective pins 721 and 731 on the power switch module 700 of the inverter 100. The power switch module 700 may include control pins including a Kelvin emitter pin 722, a temperature sensor +pin 723, a temperature sensor −pin 724, a driver source pin 732, and a current sensor pin 733.

The threshold 810 may be provided as a percentage of a maximum current capability, such as 400 $A_{rms}$, for example, of the inverter 100, and a number of dies of each of the Si power switch 702 and the SiC power switch 701 may be selected based on the threshold 810 and the maximum current capability while maintaining a same package structure for power switch module 700. The threshold 810 may be provided as 33% of a maximum current capability ($I_{max}$) of the inverter 100, so that the SiC power switch 701 is operated below 33% $I_{max}$ and the Si power switch 702 is operated at or above 33% $I_{max}$. $I_{max}$ may be 400$A_{rms}$, an area of the Si power switch 702 may be 350 mm$^2$, and an area of the SiC power switch 701 may be 44 mm$^2$. The threshold 810 may be selected based on one or more of a standard die size, packaging constraints, or vehicle current requirements, for example. The configurations above are provided merely as examples, and the disclosure is not limited thereto.

The Si gate driver may be further configured to turn off the Si power switch 702 when the current requirement of the inverter 100 is below the threshold 810 (see region 820 in FIG. 8), and the SiC gate driver may be further configured to turn off the SiC power switch 701 when the current requirement of the inverter 100 is at or above the threshold 810 (see region 830 in FIG. 8).

The system may include a set of input terminals 285 configured to receive direct current (DC) power from power supply 280, and a set of output terminals 295. The power switch module 700 may be configured to receive a signal from a controller 300 to operate the Si gate driver and the SiC gate driver to generate alternating current (AC) power, and the set of output terminals 295 may be configured to output the generated AC power.

The inverter 100 may be configured to receive the DC power and generate the AC power. The system may further include a motor 290 configured to receive the generated AC power from the inverter 100, and to rotate based on the received AC power. Additionally, the inverter 100 may be bidirectional, and used to convert DC power to AC power, or to convert AC power to DC power, such as during regenerative braking, for example. During an AC to DC power conversion, the set of input terminals 285 may be configured to output DC power, and the set of output terminals 295 may be configured to receive AC power from a rotation of the motor 290.

Figure 8:
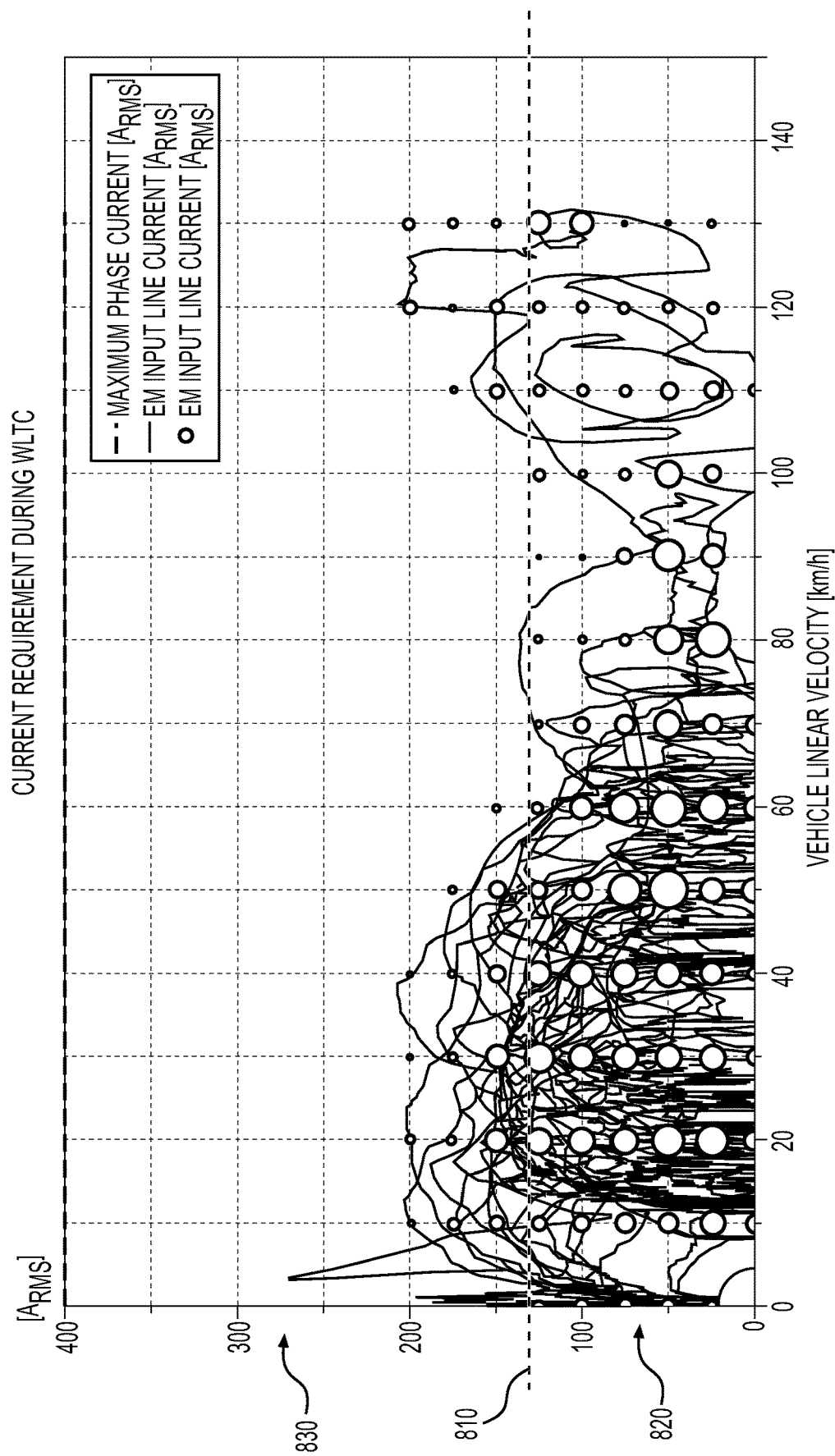
FIG. 8 depicts a usage graph for a hybrid inverter power switch with alternating control, according to one or more embodiments.

FIG. 8 depicts a usage graph for a hybrid inverter power switch module 700 with alternating control, according to one or more embodiments.

As shown in FIG. 8, the power switch module 700 may include an Si gate driver configured to provide the Si gate driving signal to operate the Si power switch 702 when a current requirement of the inverter 100 is at or above a threshold 810 (see region 830), such as, for example, 133 $A_{rms}$ (⅓ of the maximum current capability of 400 $A_{rms}$), and an SiC gate driver configured to provide the SiC gate driving signal to operate the SiC power switch 701 when the current requirement of the inverter 100 is below the threshold 810 (see region 820). The Si gate driver may be further configured to turn off the Si power switch 702 when the current requirement of the inverter 100 is below the threshold (see region 820), and the SiC gate driver may be further configured to turn off the SiC power switch 701 when the current requirement of the inverter 100 is at or above the threshold 810 (see region 830).

Figure 9:
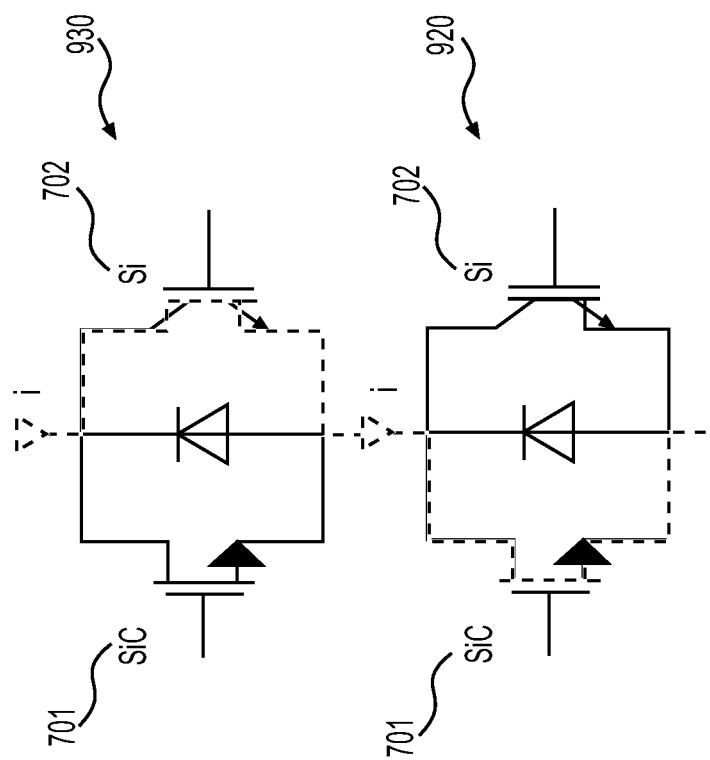
FIG. 9 depicts a high level circuit diagram for a hybrid inverter power switch with alternating control, according to one or more embodiments.

FIG. 9 depicts a high level circuit diagram for a hybrid inverter power switch module 700 with alternating control, according to one or more embodiments.

As shown in FIG. 9, the Si power switch 702 may be configured to pass current in an on state based on the Si gate driving signal (see state 930), and the SiC power switch 701 may be configured to pass current in an on state based on the SiC gate driving signal (see state 920).

Figure 10:
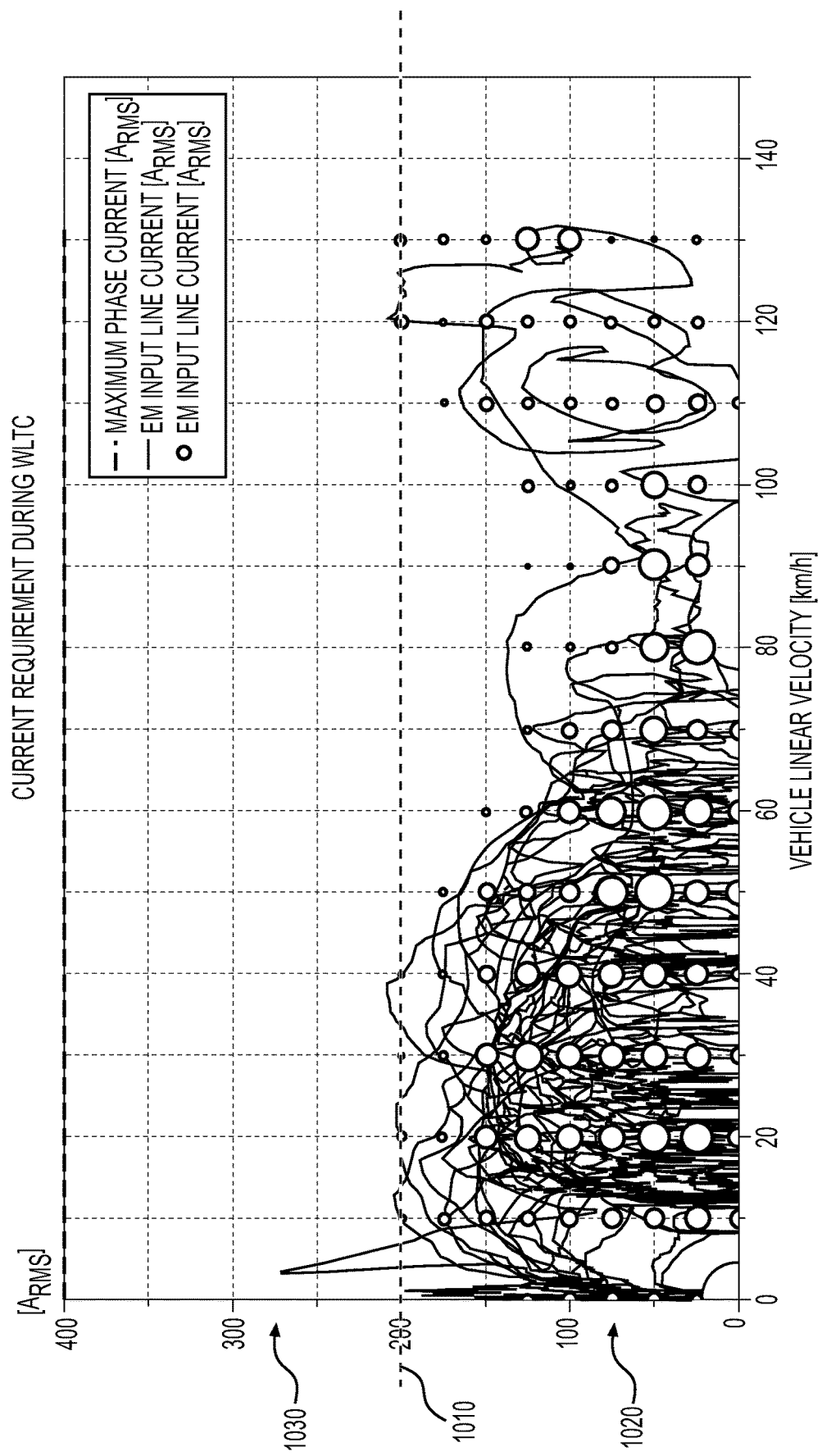
FIG. 10 depicts a usage graph for a hybrid inverter power switch with single and parallel control, according to one or more embodiments.

FIG. 10 depicts a usage graph for a hybrid inverter power switch module 700 with single and parallel control, according to one or more embodiments.

As shown in FIG. 10, the power switch module 700 may include an Si gate driver configured to provide the Si gate driving signal to operate the Si power switch 702 when a current requirement of the inverter 100 is at or above a threshold 1010 (see region 1030), such as, for example, 200 $A_{rms}$ (½ of the maximum current capability of 400 $A_{rms}$), and an SiC gate driver configured to provide the SiC gate driving signal to operate the SiC power switch 701 when the current requirement of the inverter 100 is below the threshold 1010 (see region 1020). The Si gate driver may be further configured to turn off the Si power switch 702 when the current requirement of the inverter 100 is below the threshold 1010 (see region 1020), and the SiC gate driver may be further configured to operate the SiC power switch 701 when the current requirement of the inverter 100 is at or above the threshold 1010 (see region 1030). The configurations above are provided merely as examples, and the disclosure is not limited thereto.

Figure 11:
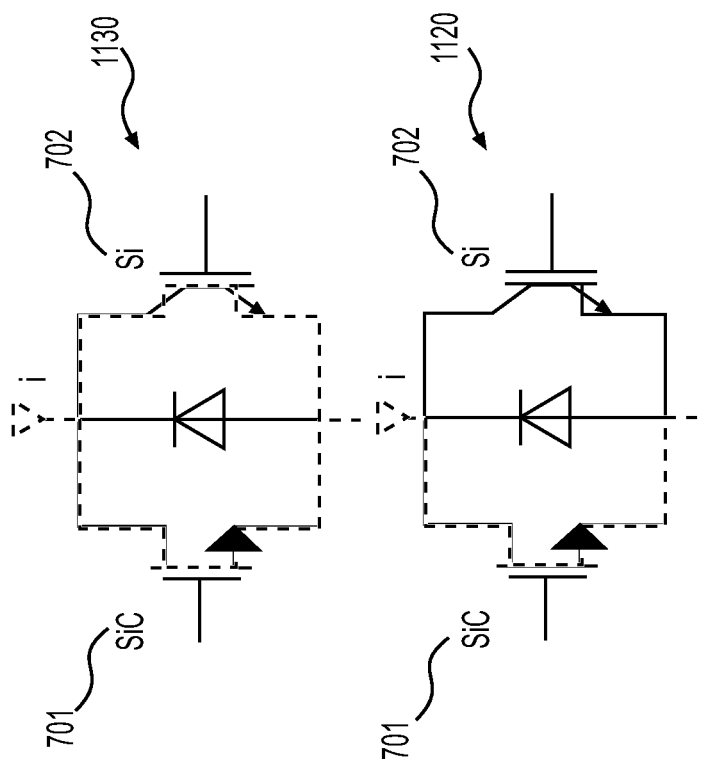
FIG. 11 depicts a high level circuit diagram for a hybrid inverter power switch with single and parallel control, according to one or more embodiments.

FIG. 11 depicts a high level circuit diagram for a hybrid inverter power switch module 700 with single and parallel control, according to one or more embodiments.

As shown in FIG. 11, the Si power switch 702 may be configured to pass current in an on state based on the Si gate driving signal, and the SiC power switch 701 may be configured to pass current in an on state based on the SiC gate driving signal. Specifically, with reference to FIGS. 10 and 11, the Si power switch 702 may be configured to pass current in an on state based on the Si gate driving signal provided when the current requirement of the inverter 100 is at or above the example threshold 1010 of 200 $A_{rms}$ (see state 1130 and corresponding region 1030) and block current in an off state based on the Si gate driving signal not being provided when the current requirement of the inverter 100 is below the example threshold 1010 of 200 $A_{rms}$ (see state 1120 and corresponding region 1020). The SiC power switch 701 may be configured to pass current in an on state based on the SiC gate driving signal provided when the current requirement of the inverter 100 is at or above the example threshold 1010 of 200 $A_{rms}$ (see state 1130 and corresponding region 1030) and also pass current in an on state based on the Si gate driving signal being provided when the current requirement of the inverter 100 is below the example threshold 1010 of 200 $A_{rms}$ (see state 1120 and corresponding region 1020). When the current requirement of the inverter 100 is at or above the example threshold 1010 of 200 $A_{rms}$ (see region 1030), the Si power switch 702 and the SiC power switch 701 may be operated in parallel (see state 1130), so that both the Si power switch 702 and the SiC power switch 701 pass current in an on state.

Figure 12:
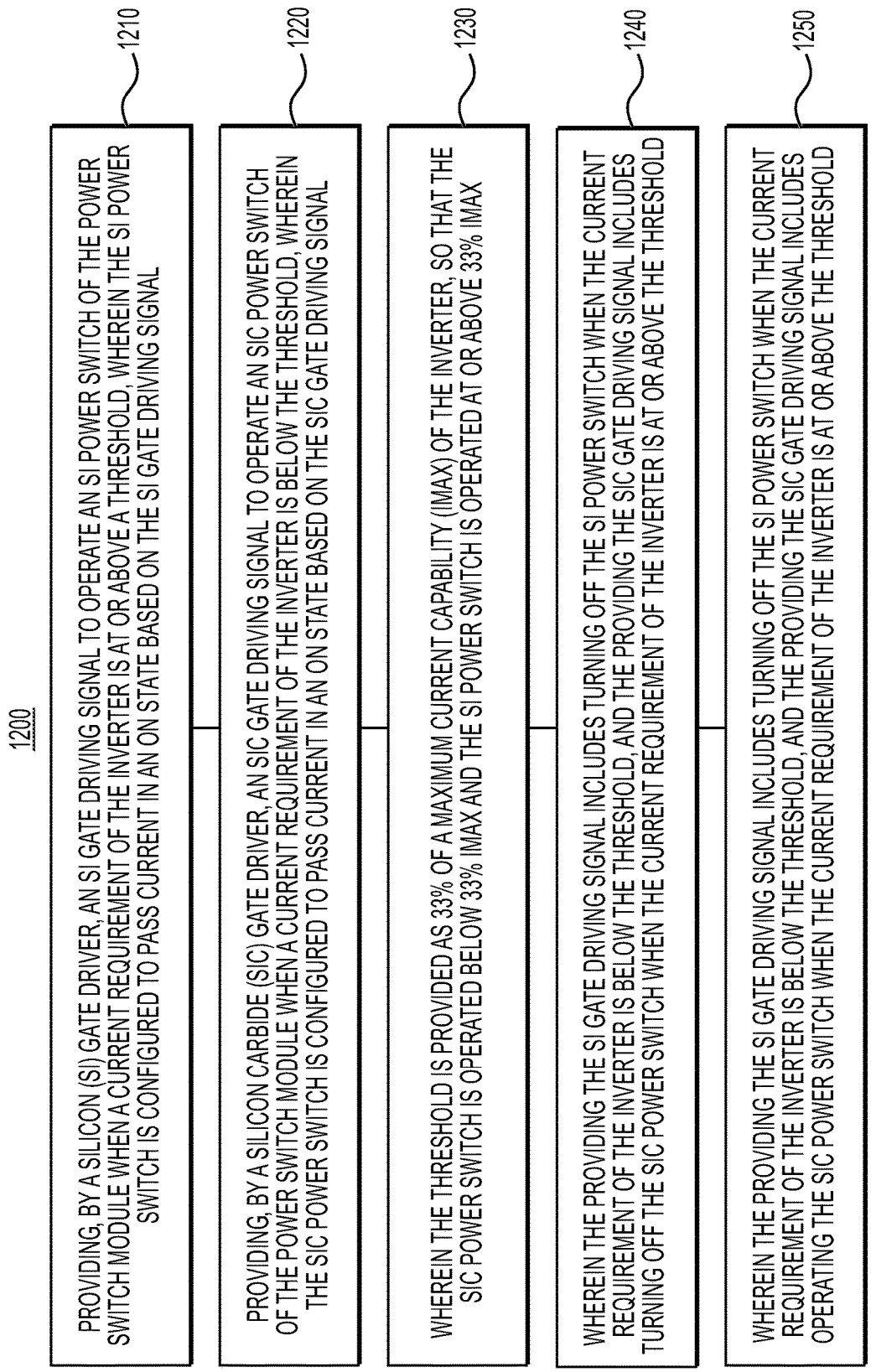
FIG. 12 depicts a method for controlling a power switch module for an inverter, according to one or more embodiments.

FIG. 12 depicts a method for controlling a power switch module for an inverter, according to one or more embodiments.

A method 1200 for controlling a power switch module 700 for an inverter 100 may include providing, by an Si gate driver, an Si gate driving signal to operate an Si power switch 702 of the power switch module 700 when a current requirement of the inverter 100 is at or above a threshold 810, where the Si power switch 702 is configured to pass current in an on state based on the Si gate driving signal (operation 1210), and providing, by an SiC gate driver, an SiC gate driving signal to operate an SiC power switch 701 of the power switch module 700 when a current requirement of the inverter 100 is below the threshold 810, wherein the SiC power switch 701 is configured to pass current in an on state based on the SiC gate driving signal (operation 1220). The method 1200 may further include the threshold 810 provided as a percentage, such as 33%, for example, of a maximum current capability ($I_{max}$) of the inverter 100, so that the SiC power switch 701 is operated below 33% $I_{max}$ and the Si power switch 702 is operated at or above 33% $I_{max}$ (operation 1230). The method 1200 may further include the providing the Si gate driving signal includes turning off the Si power switch 702 when the current requirement of the inverter 100 is below the threshold 810, and the providing the SiC gate driving signal includes turning off the SiC power switch 701 when the current requirement of the inverter 100 is at or above the threshold 810 (operation 1240). The method 1200 may further include the providing the Si gate driving signal includes turning off the Si power switch 702 when the current requirement of the inverter 100 is below the threshold 1010, and the providing the SiC gate driving signal includes operating the SiC power switch 701 when the current requirement of the inverter is at or above the threshold 1010 (operation 1250).

As described in the embodiments above, advantages to the disclosed systems and methods may include a higher efficiency power switch module 700 for most driving conditions, a retention of high current capability when high power is required, a preservation of peak performance capabilities of the power switch module 700, a reduction of cost of the power switch module 700, a reduction in material of a limited resource (SiC), and providing a scalable solution while maintaining standard packaging and integration into the inverter 100. The disclosed systems and methods may use different types of switches under different operating conditions.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for a power switch module for an inverter, the system comprising:
   a Silicon (Si) power switch configured to pass current in an on state based on an Si gate driving signal;
   a Silicon Carbide (SiC) power switch configured to pass current in an on state based on an SiC gate driving signal;
   an Si gate driver configured to provide the Si gate driving signal to operate the Si power switch when a current requirement of the inverter is at or above a threshold; and
   an SiC gate driver configured to provide the SiC gate driving signal to operate the SiC power switch when the current requirement of the inverter is below the threshold.

2. The system of claim 1, wherein the Si power switch includes two Si dies, and the SiC power switch includes two SiC dies.

3. The system of claim 2, wherein the two Si dies are an insulated-gate bipolar transistor (IGBT) and a diode.

4. The system of claim 2, wherein the two SiC dies are metal-oxide-semiconductor field-effect transistors (MOSFETs).

5. The system of claim 1, further comprising a source tab and a drain tab electrically connected to the Si power switch and the SiC power switch.

6. The system of claim 1, wherein the Si gate driver and the SiC gate driver are respective pins on the power switch module of the inverter.

7. The system of claim 6, further comprising:
   a Kelvin emitter pin,
   a temperature sensor +pin,
   a temperature sensor −pin,
   a driver source pin, and
   a current sensor pin.

8. The system of claim 1, wherein the threshold is provided as a percentage of a maximum current capability of the inverter, and
   a number of dies of each of the Si power switch and the SiC power switch is selected based on the threshold and the maximum current capability while maintaining a same package for the power switch module.

9. The system of claim 1, wherein the threshold is provided as 33% of a maximum current capability ($I_{max}$) of the inverter, so that the SiC power switch is operated below 33% $I_{max}$ and the Si power switch is operated at or above 33% $I_{max}$.

10. The system of claim 9, wherein $I_{max}$ is 400$A_{rms}$, an area of the Si power switch is 350 mm$^2$ and an area of the SiC power switch is 44 mm$^2$.

11. The system of claim 1, wherein the Si gate driver is further configured to turn off the Si power switch when the current requirement of the inverter is below the threshold, and the SiC gate driver is further configured to turn off the SiC power switch when the current requirement of the inverter is at or above the threshold.

12. The system of claim 1, wherein the Si gate driver is further configured to turn off the Si power switch when the current requirement of the inverter is below the threshold, and the SiC gate driver is further configured to operate the SiC power switch when the current requirement of the inverter is at or above the threshold.

13. The system of claim 1, further comprising:
   a set of input terminals configured to pass direct current (DC) power; and
   a set of output terminals configured to pass alternating current (AC) power, wherein the power switch module is configured to receive a signal from a controller to operate the Si gate driver and the SiC gate driver to generate AC power from DC power received through the set of input terminals or to generate DC power from AC power received through the set of the output terminals.

14. The system of claim 13,
wherein the inverter is configured to receive or generate the DC power and receive or generate the AC power; and
the system further comprises:
a motor configured to receive the generated AC power from the inverter, and to rotate based on the received AC power, or to provide generated AC power to the inverter based on a rotation of the motor.

15. A method for controlling a power switch module for an inverter, the method comprising:
providing, by a Silicon (Si) gate driver, an Si gate driving signal to operate an Si power switch of the power switch module when a current requirement of the inverter is at or above a threshold, wherein the Si power switch is configured to pass current in an on state based on the Si gate driving signal, and
providing, by a Silicon Carbide (SiC) gate driver, an SiC gate driving signal to operate an SiC power switch of the power switch module when the current requirement of the inverter is below the threshold, wherein the SiC power switch is configured to pass current in an on state based on the SiC gate driving signal.

16. The method of claim 15, wherein the threshold is provided as 33% of a maximum current capability ($I_{max}$) of the inverter, so that the SiC power switch is operated below 33% $I_{max}$ and the Si power switch is operated at or above 33% $I_{max}$.

17. The method of claim 15, wherein the providing the Si gate driving signal includes turning off the Si power switch when the current requirement of the inverter is below the threshold, and the providing the SiC gate driving signal includes turning off the SiC power switch when the current requirement of the inverter is at or above the threshold.

18. The method of claim 15, wherein the providing the Si gate driving signal includes turning off the Si power switch when the current requirement of the inverter is below the threshold, and the providing the SiC gate driving signal includes operating the SiC power switch when the current requirement of the inverter is at or above the threshold.

19. A system including a controller to control a power switch module of a direct-current (DC) to alternating current (AC) inverter, the controller comprising:
a memory configured to store instructions; and
at least one processor configured to execute the stored instructions to perform operations including:
providing, to a Silicon (Si) gate driver of the power switch module, an Si gate driving signal to operate an Si power switch of the power switch module when a current requirement of the inverter is at or above a threshold, wherein the Si power switch is configured to pass current in an on state based on the Si gate driving signal, and
providing, by a Silicon Carbide (SiC) gate driver of the power switch module, an SiC gate driving signal to operate an SiC power switch of the power switch module when the current requirement of the inverter is below the threshold, wherein the SiC power switch is configured to pass current in an on state based on the SiC gate driving signal.

20. The system of claim 19,
wherein the providing the Si gate driving signal includes turning off the Si power switch when the current requirement of the inverter is below the threshold, and
wherein the providing the SiC gate driving signal includes:
turning off the SiC power switch when the current requirement of the inverter is at or above the threshold, or
operating the SiC power switch when the current requirement of the inverter is at or above the threshold.

* * * * *

UNITED STATES PATENT AND TRADEMARK OFFICE
CERTIFICATE OF CORRECTION

| | | |
|---|---|---|
| PATENT NO. | : 12,101,047 B2 | Page 1 of 1 |
| APPLICATION NO. | : 17/658686 | |
| DATED | : September 24, 2024 | |
| INVENTOR(S) | : Eric Bourniche et al. | |

It is certified that error appears in the above-identified patent and that said Letters Patent is hereby corrected as shown below:

On the Title Page

(73) Assignee: delete "Borg Warner" and insert --BorgWarner--.

Signed and Sealed this
Fifth Day of November, 2024

Katherine Kelly Vidal
*Director of the United States Patent and Trademark Office*